United States Patent
Vahatalo et al.

(10) Patent No.: US 6,182,101 B1
(45) Date of Patent: Jan. 30, 2001

(54) METHOD FOR SAMPLING FREQUENCY CONVERSION EMPLOYING WEIGHTED AVERAGES

(75) Inventors: Antti Vahatalo; Olli Ali-Yrkko, both of Tampere (FI)

(73) Assignee: Nokia Mobile Phones, Ltd., Salo (FI)

( * ) Notice: Under 35 U.S.C. 154(b), the term of this patent shall be extended for 0 days.

(21) Appl. No.: 08/524,103

(22) Filed: Aug. 21, 1995

Related U.S. Application Data

(63) Continuation of application No. 08/163,429, filed on Dec. 8, 1993, now abandoned.

(51) Int. Cl.[7] ...................................................... G06F 17/17
(52) U.S. Cl. ............................................................. 708/313
(58) Field of Search ................................... 708/290, 300, 708/301, 302, 303, 313, 103

(56) References Cited

U.S. PATENT DOCUMENTS

| | | | |
|---|---|---|---|
| 4,020,332 | * 4/1977 | Crochiere et al. | 364/724.1 |
| 4,604,720 | * 8/1986 | Stikvoort | 364/724.1 |
| 5,068,716 | * 11/1991 | Takayama et al. | 348/708 |
| 5,159,338 | * 10/1992 | Takahashi | 341/61 |
| 5,335,194 | * 8/1994 | Clayton et al. | 364/724.1 |

FOREIGN PATENT DOCUMENTS 0 323 200   7/1989   (EP) .

* cited by examiner

Primary Examiner—Chuong Dinh Ngo
(74) Attorney, Agent, or Firm—Perman & Green, LLP

(57) ABSTRACT

An improved method converts a first sampling rate of signal values to a second sampling rate, the second sampling rate being a non-integer multiple of the first sampling rate. The method includes the steps of: interpolating between successive signal values occurring at the first sampling rate to derive further signal values at an integer multiple sampling rate thereof, the integer multiple sampling rate falling within a range that is a greater than 0.5 and less than two times an integer multiple of the second sampling rate; employing a method of weighted average interpolation or decimation to derive from the signal values occurring at an integer multiple sampling rate of the first sampling rate, signal value magnitudes occurring at the integer multiple of the second signal sampling rate; and decimating the signal values at the integer multiple of the second sampling rate by an integer multiple factor to derive second sampling rate.

3 Claims, 2 Drawing Sheets

METHOD FOR SAMPLING FREQUENCY CONVERSION EMPLOYING WEIGHTED AVERAGES

This is a continuation of application(s) Ser. No. 08/163,429 filed on Dec. 08, 1993, now abandoned.

FIELD OF THE INVENTION

This invention relates to signal sampling rate conversion and, more particularly, to conversion of a digital signal at one sampling rate to a set of signals at a second sampling rate, employing a method of weighted averages.

BACKGROUND OF THE INVENTION

During digital signal processing, a common occurrence is to find that the sampling rate must be changed e.g. a signal is read from an analog-to-digital converter (A/D) which operates at a first sampling rate, digitally processed and then fed to a digital-to-analog converter (D/A) which operates at a second sampling rate. During this process, the digital values are also filtered to exhibit a particular frequency/bandwidth characteristic.

The sampling rate conversion process determines the digital value magnitudes of signals at the second sampling rate from the digital values of signals occurring at the first sampling rate. If the first and second data sampling rates are integer multiples of each other, determination of output signal magnitudes can be easily accomplished by either interpolation or decimation. If however, the first and second sampling rates are not integer multiples, the solution to the problem becomes more computationally complex.

The prior art has employed several techniques to accomplish sampling rate conversion (with filtering) and has used both infinite impulse response (IIR) and finite impulse response (FIR) filters. The sampling rate conversion process has involved a multiplication (by interpolation) of the input sampling rate by an integer factor to achieve a higher frequency sampling rate which is also an integer multiple of the desired second sampling rate. Then, after filtering, the integer multiple sampling rate is divided (by decimation) by an integer value to arrive at the desired second sampling rate.

As an example, a digital signal having a sampling rate of 20 kHz is sent to a D/A converter that has a sampling rate of 97.2 kHz. Thus, the signal with a 20 kHz sampling rate must be changed to a 97.2 kHz sampling rate and the signal must be filtered using specified filter characteristics. If an IIR filter is employed, the 20 kHz sampling rate data may be interpolated by a factor of 243 to a sampling rate of 4,860 kHz (4,860 kHz being a 50 times multiple of the D/A converter sampling rate of 97.2 kHz). The resulting signal with 4,860 kHz sampling rate data is then filtered using an IIR filter and thereafter, the output is decimated by a factor of 50 to achieve the desired output data sampling rate of 97.2 kHz.

As is known to those skilled in the art, the response of an IIR filter is a function of current and past input signal samples and past output signal samples. Its dependency on past outputs gives rise to an infinite duration of the filter's output response even when input values have stopped. IIR filter functions must be computed at the input sampling rate regardless of subsequent data decimation operations that ignore some of the filter's outputs. This is because each output is required in order to compute the filter's subsequent outputs. In the exemplary case of a sampling rate conversion from 20 kHz to 97.2 kHz, the very high integer multiple sampling frequency (i.e. 4,860 kHz) requires that the IIR sample conversion procedure perform a very large number arithmetic operations even though the IIR filter only requires approximately eight coefficients to satisfy the filter requirement.

When using an FIR filter, a signal with a 20 kHz sampling rate data is again interpolated by a factor of 243 to 4,860 kHz, filtered and then decimated by a factor of 50 to 97.2 kHz. However, the FIR filter enables interpolation and decimation to be combined so that all calculations are accomplished at the second sampling frequency of 97.2 kHz. The FIR filter avoids the computational problems of the IIR filter because it employs only a finite number of past input samples. While the computational load using the FIR filter is low compared to the IIR filter, the number of coefficients for the FIR filter is large (approximately 1000) and because of this, stored coefficients consume a substantial amount of memory.

Accordingly, it is an object of this invention to provide a sampling frequency conversion method that places minimum requirements upon supporting computational apparatus.

SUMMARY OF THE INVENTION

An improved method converts a first sampling rate of signal values to a second sampling rate, the second sampling rate being a non-integer multiple of the first sampling rate. The method comprises the steps of: interpolating between successive signal values occurring at the first sampling rate to derive further signal values at an integer multiple sampling rate thereof, the integer multiple sampling rate falling within a range that is a greater than 0.5 and less than two times an integer multiple of the second sampling rate; employing a method of weighted average interpolation to derive from the signal values occurring at the integer multiple sampling rate of the first sampling rate, signal value magnitudes occurring at an integer multiple of the second signal sampling rate; and decimating the signal values at the integer multiple of the second sampling rate by an integer multiple factor to derive second sampling rate signal values.

DETAILED DESCRIPTION OF THE INVENTION

Figure 1:
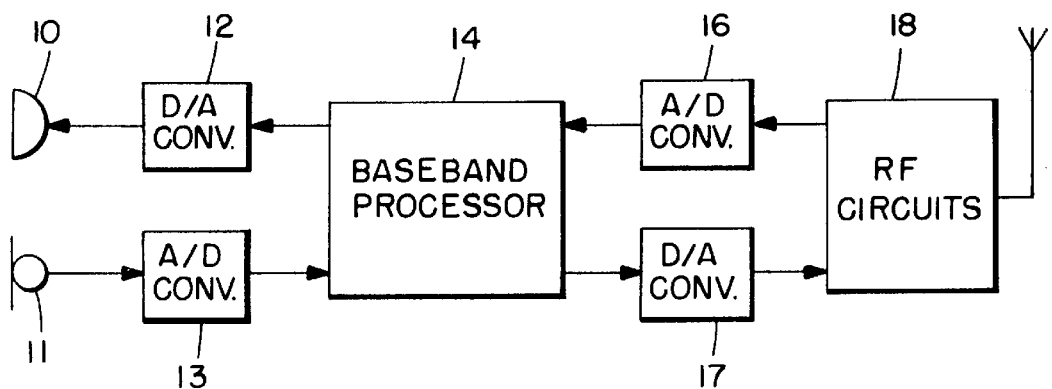
FIG. 1 is a high level block diagram of the transmission portion of a cellular telephone.

In FIG. 1, a simplified block diagram of a basic mobile radiotelephone is shown. A microphone 11 provides an audio input signal which is converted to digital samples by A/D converter 13. Digital baseband processor 14, which includes a digital signal processor, processes the input samples and sends the output samples to D/A converter 17, which operates at 97.2 kHz sampling rate. From D/A converter 17, the signal is fed to RF (Radio Frequency) circuits 18. In the opposite direction, the RF circuits 18 receive a signal, which is converted to digital values by an A/D converter 16, processed by digital baseband processor 14, converted back to analog signals by a D/A converter 12, and finally fed to a speaker 10.

The mobile radiotelephone depicted in FIG. 1 must be able to send a data signal in order to communicate with a base station. The data signal, which has a rate of 20,000 baud/s, is processed by baseband processor 14, converted to analog signals by a D/A converter 17 and fed to RF circuits 18. The data signal which has a sampling frequency of 20,000 baud/s (i.e. 20 kHz) must now be filtered with a specified filter characteristic and sent to D/A converter 17, which operates at 97.2 kHz.

The signal with the 20 kHz sampling rate is now interpolated to a higher sampling rate which is a multiple of the 20 kHz rate. The signal is then filtered using specified filter characteristics, converted to an integer multiple sampling rate of the 97.2 kHz using a weighted average method and then decimated by an integer to obtain an output rate of 97.2 kHz. The integer multiple of the 20 kHz sampling frequency should be greater than one half and less than twice the integer multiple of the 97.2 kHz sampling frequency.

A similar sampling rate conversion procedure can be used to change the sampling rate of a signal which is fed from A/D converter 13 via baseband processor 14 to D/A converter 17 and for a signal which is fed from A/D converter 16 via baseband processor 14 to the D/A converter 12. The procedure of changing the sampling rates is similar, although the sampling rates are different.

Using the exemplary sampling rates, a signal with the 20 kHz sampling rate is to be interpolated by a factor of 24 to a 480 kHz. The interpolation is accomplished using an FIR filter having an order of approximately 100. The integer multiple data sampling rate is then converted from 480 kHz to 486 kHz using a weighted average interpolation procedure to be described below. The resulting 486 kHz data sampling rate is then decimated by a factor of 5 to achieve an output sampling rate of 97.2 kHz.

Using an FIR filter, the decimation and weighted average calculations can be accomplished in a combined manner. The FIR filter calculation sampling rate is twice the 97.2 kHz sampling rate, as a weighted average requires two input samples to calculate a single output sample.

While an interpolation value of 24 is employed to convert the 20 kHz sampling rate to a 480 kHz multiple (allowing a low level of distortion), any other integer number can be employed, depending upon the required output signal's distortion. It is preferred that the multiple of the input sampling rate fall within a range that is greater than 0.5 and less than two times an integer multiple of the desired output signal sampling rate. It is to be clearly understood that the specified data sampling rate values recited herein are only for exemplary purposes and that the invention is generally applicable wherever one data sampling rate is to be converted to a second data sampling rate.

Figure 2:
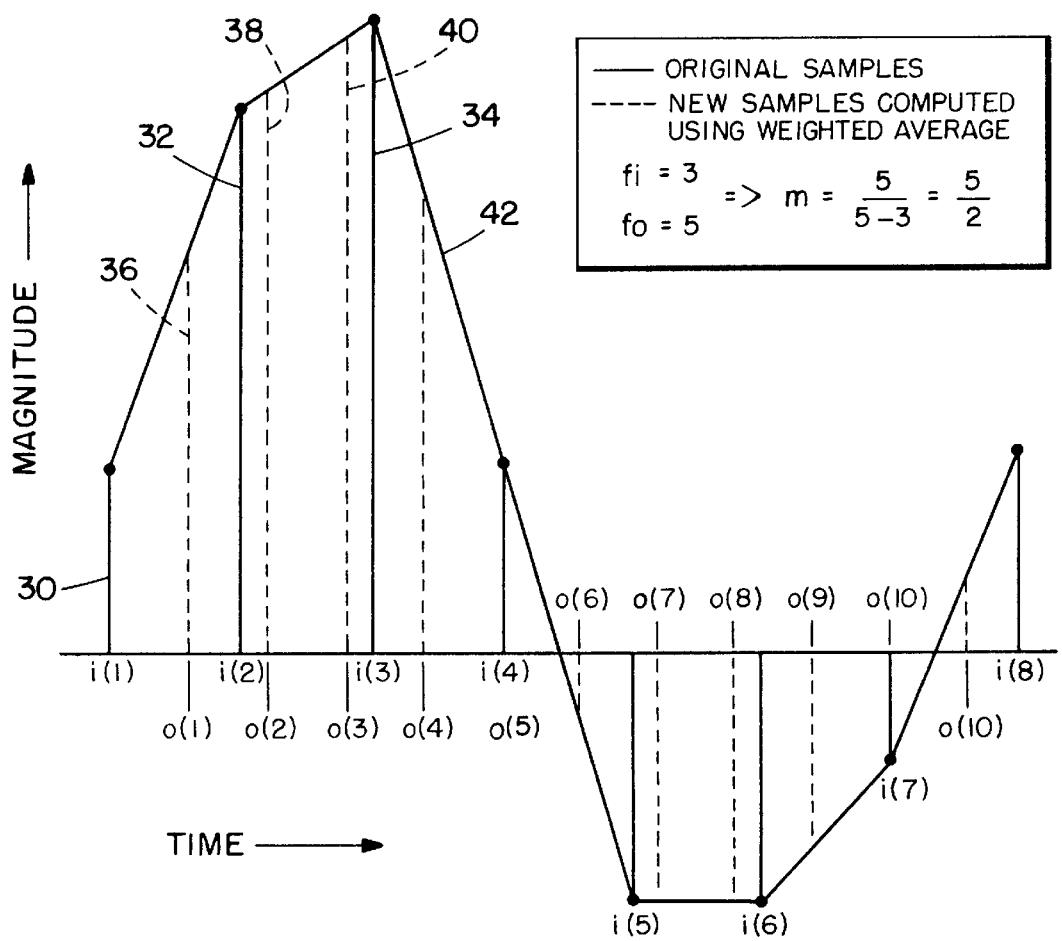
FIG. 2 is a plot of input signal sample values occurring at an integer multiple of a first sampling rate and output signal values occurring at a second sampling rate, derived by weighted average interpolation.
Figure 3:
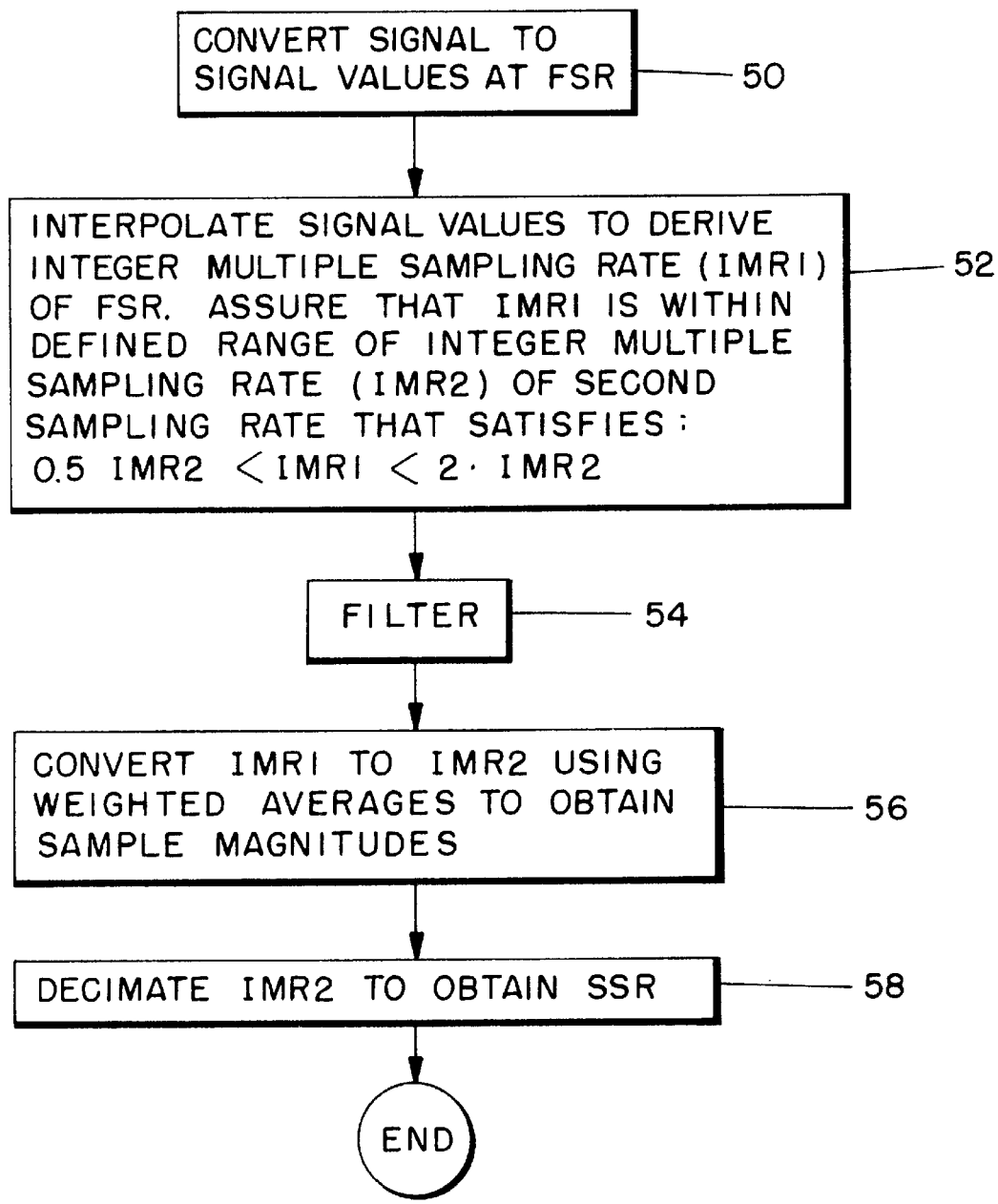
FIG. 3 is a high level flow diagram illustrating the operation of the invention shown in FIG. 1.

Turning now to FIGS. 2 and 3, a further example of the invention will provided using more simplified input and output sampling rates to enable a better understanding of the invention. Assume that the input sampling frequency or sampling rate (fin) is 3 and the output sampling frequency or sampling rate (fout) is 5. Each input sample is designated i(n) where i is the input amplitude and n is the sequence number of the samples. Output data samples are designated o(n) where o is the output data sample amplitude. The interpolation sampling rate from input to output is 5/3.

In FIG. 2, an exemplary set of input samples i(n) 30, 32, 34 are shown plotted along a time line. A plurality of output samples o(n) 36, 38, 40 etc. are shown interspersed (dotted) with the input samples i(n). Line 42, which connects the magnitudes of each of the input and output samples shows the approximate wave shape of the sampled signal. The problem presented, once the amplitudes of input samples i(n) are known, is to find the amplitudes of output samples o(n). A rational factor m is used in the method of the invention and is determined as follows:

$$m = fout/(fout-fin)$$

Because fout and fin can be fractional numbers, the numerator (fout) and denominator (fout−fin) should be converted to higher terms by multiplying with a suitable integer to make the numerator ("mnum") and denominator ("mden") integers. Then m can be expressed as follows:

$$m = mnum/mden$$

In the above equation, the numerator (mnum) and denominator (mden) are integers. Each output sample o(n) can be determined as follows:

$$o(n) = x \cdot i(k) + (1-x) \cdot i(k+1) \quad (1)$$

where:

$$x = \frac{((n*mden) \bmod mnum)}{mnum} \quad (2)$$

$$k = n - \operatorname{trunc}\left(\frac{n*mden}{mnum}\right) \quad (3)$$

"trunc(y)" is largest integer not greater than y
"a mod b" is the remainder or modulus of the division a/b A review of equations 1–3 indicates that, in the first phrase of equation 1, the value x is a weighting value, k is an index of input samples and n is an index of output samples.

Where m=5/2, the following table shows the first ten values of x and k as calculated from equations 2 and 3:

| n | x | k |
|---|---|---|
| 1 | 2/5 | 1 |
| 2 | 4/5 | 2 |
| 3 | 1/5 | 2 |
| 4 | 3/5 | 3 |
| 5 | 0 | 3 |
| 6 | 2/5 | 4 |
| 7 | 4/5 | 5 |
| 8 | 1/5 | 5 |
| 9 | 3/5 | 6 |
| 10 | 0 | 6 |

Using equation 1, the first ten output values o(n) may be calculated as follows from the x and k values shown in the above table.

$$o(1) = 2/5 \cdot i(1) + 3/5 \cdot i(2)$$

$$o(2) = 4/5 \cdot i(2) + 1/5 \cdot i(3)$$

$$o(3) = 1/5 \cdot i(2) + 4/5 \cdot i(3)$$

$$o(4) = 3/5 \cdot i(3) + 2/5 \cdot i(4)$$

$$o(5) = 0 \cdot i(3) + i(4) = i(4)$$

$$o(6) = 2/5 \cdot i(4) + 3/5 \cdot i(5)$$

$o(7) = \frac{4}{5} \cdot i(5) + \frac{1}{5} \cdot i(6)$ $o(8) = \frac{1}{5} \cdot i(5) + \frac{4}{5} \cdot i(6)$ $o(9) = \frac{3}{5} \cdot i(6) + \frac{2}{5} \cdot i(7)$ $o(10) = 0 * i(6) + i(7) = i(7)$ The results from the above table are plotted in FIG. 2 and illustrate that, for instance, output o(1) is derived by taking ⅖ of the input magnitude of sample i(1) and adding to it ⅗ of the magnitude of input sample i(2). Similar calculations are carried out to obtain o(2–10).

The weighted interpolation procedure shown above is performed when the value of the integer multiple of the input data sampling rate is less than the value of the desired multiple of the output data sampling rate. If the integer multiple of the input data sampling rate is larger (but within the above-noted range criteria), then sample values at the integer multiple of output sampling rate are achieved by using a decimation procedure rather than an interpolation procedure. The decimation procedure is as follows:

d is determined as follows:

$$d = fin/(fin - fout)$$

Because fout and fin can be fractional numbers, the numerator (fout) and denominator (fout–fin) should be converted to higher terms by multiplying with a suitable integer to make the numerator and denominator integers. Then m can be expressed as follows:

$$d = dnum/dden$$

In the above equation, the numerator (dnum) and denominator (dden) are integers.

In such case, the output data sample values are determined from equations 4–6 below.

$$o(n) = (1-x)*i(k) + x*i(k+1) \quad (4)$$

where:

$$x = \frac{((n*dden) \bmod dnum)}{dnum} \quad (5)$$

$$k = n + trunc\left(\frac{n*dden}{dnum}\right) \quad (6)$$

"trunc(y)" is largest integer not greater than y
"a mod b" is remainder or modulus of the division a/b As one skilled in the art will understand, the decimation procedure is essentially an image of the interpolation procedure and proceeds accordingly, using equations 4–6.

Turning to FIG. 3, a high level flow diagram is shown that illustrates the sampling rate conversion procedure of the invention. As above indicated, the method converts a first sampling rate to a second different sampling rate, using an FIR filter. Initially, an analog input signal is converted to digital samples at a first sampling rate (FSR) as shown in box 50. Next, the FSR values are interpolated to derive an integer multiple data sampling rate of the FSR. That integer multiple (IMR1) bears a predetermined relationship to an integer multiple (IMR2) of the second output data sampling rate as follows (see box 52).

$$0.5*IMR2 < IMR1 < 2*IMR2.$$

IMR1 is then filtered using an FIR (box 54) and is converted to IMR2 using a weighted average interpolation technique to obtain magnitudes of values that comprise IMR2 (box 56). Then, IMR2 is decimated by an integer value to obtain the second output sampling rate (box 58).

It should be understood that the foregoing description is only illustrative of the invention. Various alternatives and modifications can be devised by those skilled in the art without departing from the invention.

What is claimed is:

1. A method for converting a first sampling rate of input electrical signal values to a second sampling rate of output electrical signal values, the second sampling rate being a non-integer multiple of the first sampling rate, and for determining amplitudes of said second sampling rate output signal values from first sampling rate input signal values, said method implemented by a computer and comprising the steps of:

a. In a digital signal processor, interpolating linearly between successive input electrical signal values occurring at said first sampling rate to derive signal values occurring at a predetermined integer multiple sampling rate from said input signal values (said integer multiple rate hereafter referred to as: IMR1), said IMR1 falling within a range that is greater than 0.5 and less than 2 times a predetermined integer multiple of said second sampling rate (said integer multiple of said second sampling rate hereafter referred to as: IMR2);

b. using an FIR filter for interpolating linearly between said signal values occurring at said IMR1 to derive signal values occurring at IMR2; and c. using the FIR filter for decimating said signal values at IMR2 by a predetermined integer multiple factor to derive output signal values occurring at said second sampling rate.

2. The method according to claim 1 wherein said IMR1 exhibits a lower frequency than said IMR2 and step b employs a weighting factor x, where:

$$x = \frac{((n*mden) \bmod mnum)}{mnum}$$

where:

mnum/mden=fout/(fout–fin), with the fraction fout/(fout–fin) converted to higher terms to assure that mnum and mden are integer values, n=sequence number of output sample, fout=second sampling rate, fin=first sampling rate, a mod b is modulus or remainder of the division a/b and wherein each output data value at IMR2 has a magnitude o(n) where:

$$o(n) = x*i(k) + (1-x)*i(k+1)$$

where:

$$k = n - trunc\left(\frac{n*mden}{mnum}\right)$$

i=input sample magnitude and;

"trunc" (y) is largest integer not greater than y.

3. The method according to claim 1, wherein IMR1 is greater than IMR2 and wherein step b employs a weighting factor x, where:

$$x = \frac{((n*dden) \bmod dnum)}{dnum}$$

where:

dnum/dden=fin/(fin−fout), with the fraction fin/(fin−fout) converted to higher terms to assure that dnum and dden are integer values,
n=sequence number of output sample,
fout=second sampling rate,
fin=first sampling rate, and
a mod b is modulus or remainder of a division a/b; and wherein each output at IMR2 has a magnitude o(n), wherein:

$$o(n)=(1-x)*i(k)+x*i(k+1)$$

where:

$$k = n + trunc\left(\frac{n*dden}{dnum}\right)$$

i=input sample magnitude;
"trunc" (y) is largest integer not greater than y.

* * * * *